US011868210B2

(12) United States Patent
Bueb et al.

(10) Patent No.: US 11,868,210 B2
(45) Date of Patent: Jan. 9, 2024

(54) MEMORY DEVICE CROSSED MATRIX PARITY

(71) Applicant: Micron Technology, Inc., Boise, ID (US)

(72) Inventors: Christopher J. Bueb, Folsom, CA (US); Kishore K. Muchherla, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 44 days.

(21) Appl. No.: 17/553,007

(22) Filed: Dec. 16, 2021

(65) Prior Publication Data

US 2023/0195566 A1 Jun. 22, 2023

(51) Int. Cl.
*G06F 11/10* (2006.01)
*G11C 16/04* (2006.01)

(52) U.S. Cl.
CPC ...... *G06F 11/1068* (2013.01); *G11C 16/0483* (2013.01)

(58) Field of Classification Search
None
See application file for complete search history.

(56) References Cited

U.S. PATENT DOCUMENTS

| 4,660,202 | A | 4/1987 | Woodsum |
| 9,032,283 | B2 | 5/2015 | Williamson |
| 10,613,930 | B2* | 4/2020 | Hashimoto ........... G06F 3/0619 |
| 10,884,852 | B2* | 1/2021 | Seo ...................... G11C 11/4076 |
| 2002/0147954 | A1 | 10/2002 | Shea |
| 2006/0256615 | A1 | 11/2006 | Larson |
| 2016/0364294 | A1* | 12/2016 | Amato .................. H03M 13/00 |
| 2018/0067684 | A1* | 3/2018 | Benisty ................. G11C 29/52 |
| 2018/0269904 | A1* | 9/2018 | Khayat ............. H03M 13/2945 |
| 2019/0146870 | A1* | 5/2019 | Cha .................... H03M 13/2906 714/755 |
| 2020/0110661 | A1* | 4/2020 | Singidi .................. G06F 3/061 |
| 2020/0371869 | A1* | 11/2020 | Park ...................... G06F 12/121 |

(Continued)

OTHER PUBLICATIONS

Y. Cai, S. Ghose, E. F. Haratsch, Y. Luo and O. Mutlu, "Error Characterization, Mitigation, and Recovery in Flash-Memory-Based Solid-State Drives," in Proceedings of the IEEE, vol. 105, No. 9, pp. 1666-1704, Sep. 2017, doi: 10.1109/JPROC.2017.2713127. (Year: 2017).*

(Continued)

*Primary Examiner* — Daniel F. McMahon
(74) *Attorney, Agent, or Firm* — Brooks, Cameron & Huebsch, PLLC

(57) ABSTRACT

Methods, devices, and systems related to crossed matrix parity in a memory device are described. In an example, a first group of sets of parity data that each protect data stored in a row of memory cells of an array is generated. Further, a second group of sets of parity data that each protect data stored in a column of memory cells of an array is generated. The first set of parity data and the second set of parity data is sent to a host for further ECC processing. The host provides ECC data to the memory device based on the first set of parity data and the second set of parity data. The memory device repairs memory cells or retires memory cells based on the provided ECC data.

20 Claims, 4 Drawing Sheets

(56) References Cited

U.S. PATENT DOCUMENTS

2021/0357127 A1* 11/2021 Papa .................. G06F 11/1068

OTHER PUBLICATIONS

S.-H. Lim, J.-B. Lee, G.-M. Kim and W. H. Ahn, "A Stepwise Rate-Compatible LDPC and Parity Management in NAND Flash Memory-Based Storage Devices," in IEEE Access, vol. 8, pp. 162491-162506, 2020, doi: 10.1109/ACCESS.2020.3021498. (Year: 2020).*

* cited by examiner

351

```
┌─────────────────────────────────────────────────────────────┐
│ PERFORMING A PARITY OPERATION ON A FIRST SET OF DATA OF A   │
│ PLURALITY OF MEMORY CELLS COUPLED TO ACCESS LINES OF AN     │──353
│ ARRAY RESULTING IN A FIRST SET OF PARITY DATA CORRESPONDING │
│ TO EACH OF THE ACCESS LINES RESULTING IN ACCESS LINE PARITY │
│ DATA                                                        │
└─────────────────────────────────────────────────────────────┘
                              │
┌─────────────────────────────────────────────────────────────┐
│ PERFORMING AN ADDITIONAL PARITY OPERATION ON A SECOND SET OF│
│ DATA OF A PLURALITY OF MEMORY CELLS COUPLED TO SENSE LINES  │──355
│ OF THE ARRAY RESULTING IN A SECOND SET OF PARITY DATA       │
│ CORRESPONDING TO EACH OF THE SENSE LINES RESULTING IN SENSE │
│ LINE PARITY DATA                                            │
└─────────────────────────────────────────────────────────────┘
                              │
┌─────────────────────────────────────────────────────────────┐
│ SENDING THE ACCESS LINE PARITY DATA AND THE SENSE LINE      │──357
│ PARITY DATA TO A HOST                                       │
└─────────────────────────────────────────────────────────────┘
                              │
┌─────────────────────────────────────────────────────────────┐
│ RECEIVING INSTRUCTIONS TO PERFORM AN ERROR CORRECTION       │
│ OPERATION ON AT LEAST A PORTION OF THE PLURALITY OF MEMORY  │──359
│ CELLS BASED ON THE ACCESS LINE PARITY DATA AND THE SENSE    │
│ LINE PARITY DATA                                            │
└─────────────────────────────────────────────────────────────┘
                              │
┌─────────────────────────────────────────────────────────────┐
│ PERFORMING THE ERROR CORRECTION OPERATION ON THE AT         │──361
│ LEAST A PORTION OF THE PLURALITY OF MEMORY CELLS            │
└─────────────────────────────────────────────────────────────┘
```

*FIG. 3*

MEMORY DEVICE CROSSED MATRIX PARITY

TECHNICAL FIELD

The present disclosure relates generally to memory device crossed matrix parity.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), DRAM, and synchronous dynamic random access memory (SDRAM), among others. Non-volatile memory can provide persistent data by retaining stored data. when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory can be part of a memory module (e.g., a dual in-line memory module (DIMM)) used in computing devices. Memory modules can include volatile, such as DRAM, for example, and/or non-volatile memory, such as Flash memory or RRAM, for example. The DIMMs can be used as main memory in computing systems.

BRIEF DESCRIPTION OF THE DRAWINGS

FIG. 3 is a flow diagram of a method for crossed matrix parity in a memory device in accordance with a number of embodiments of the present disclosure.

DETAILED DESCRIPTION

Figure 1:
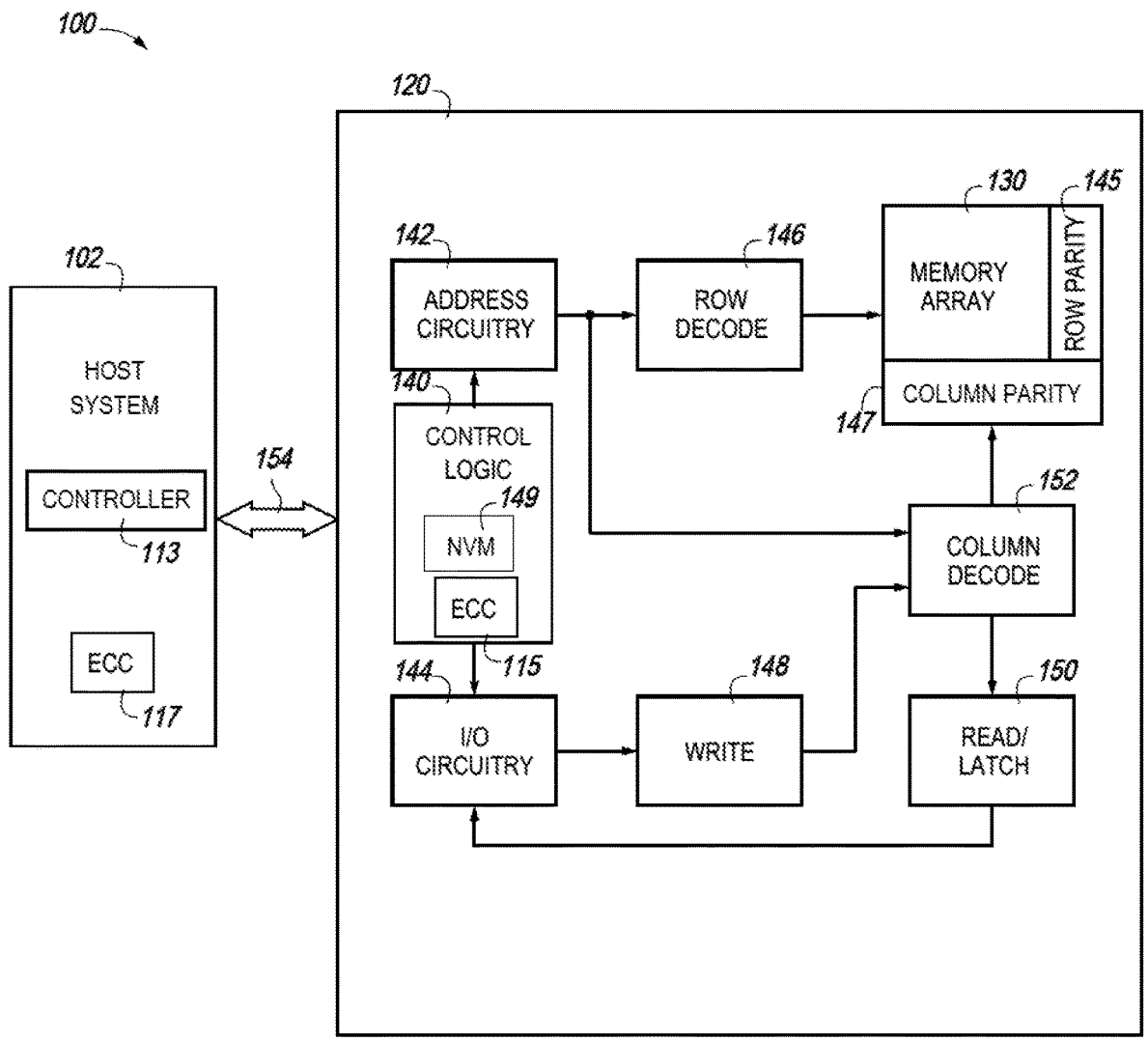
FIG. 1 is a block diagram of an apparatus in the form of a. computing system including a memory system it accordance with a number of embodiments of the present disclosure.

The present disclosure relates to methods, devices, and systems related to memory device crossed matrix parity that are described. In an example, a first group of sets of parity data that each protect data stored in a row of memory cells of an array (e.g., memory cells coupled to an access line) can be generated. A second group of sets of parity data that each protect data stored in a column of memory cells of an array (e.g., memory cells coupled to a sense line) can be generated. The first set of parity data and the second set of parity data can be sent to a host for further ECC processing. The host can provide ECC data to the memory device based on the first set of parity data and the second set of parity data. The memory device can repair memory cells, retire memory cells, etc. based on the provided ECC data.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

As a memory device is accessed a high number of times, the memory cells storing the data may experience failures due to these repeated accesses to a. particular row of memory cells (e.g., cells coupled to an access line). These intermittent failures caused by errors in the data can affect reading of the data and can be reduced by repairing the data, reading and writing the data additional times, altering timing and/or voltage associated with the memory cells, retiring damaged memory cells, etc. The quantity of errors in a row of memory cells can be determined by using parity data that protects both the rows of memory cells (e.g., horizontal) and the columns of memory cells (e.g., vertical). By doing so, the rows of memory cells that are experiencing errors, or the data stored in those rows of memory cells that include the errors, can be located within the memory device as the crossed matrix parity data can help pinpoint a more target location for where the errors are stored in the memory cells. The analysis of the horizontal and vertical parity data can be performed by a host, thereby allowing a variety of memory devices to be used with the crossed matrix parity setup without altering or changing the memory device other than some setup and/or software changes. Further, the error correction performed on the data can reduce the bit error rates (BER) and increase reliability of the data.

By performing these methods on memory cells that store data with a threshold quantity (or number) of errors, the quantity of errors in the data stored in the memory cells can be maintained below a level at which the memory can no longer be corrected. For example, error correction methods and/or systems can be limited to a number of correctable bits and/or portions of data that the method or system can correct. Once the memory array, or individual rows of cells, exceeds these limits, the memory array may become uncorrectable. By maintaining error rates below a threshold, the memory array remains correctable.

An ECC operation can include generating parity data, for example, by performing an XOR and/or RAID operation, on data stored in memory cells of the array. The parity data can be stored in (e.g., written to) a volatile and/or non-volatile memory device. In some examples, the parity data can be embedded in the data in a volatile memory device and/or a non-volatile memory device.

Data stored in the volatile and/or non-volatile memory device can be reconstructed using the parity data. A host and/or controller of the memory device can receive (e.g., read) the parity data from the memory device and reconstruct the data in response to a read failure. The read failure can be due to corrupted memory in the memory device.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "M", "N", "X", and "Y" indicates that a number of the particular feature so designated can be included with a number of embodiments of the present disclosure.

As used herein, "a number of" something can refer to one or more of such things. For example, a number of memory cells can refer to one or more memory cells. Additionally, designators such as "M", "P", and "J", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may he identified by the use of similar digits. As will be appreciated, elements shown in the various embodiments herein can be added, exchanged, and/or eliminated so as to provide a number of additional embodiments. of the present disclosure. In addition, the proportion and the relative scale of the elements provided in the figures are intended to illustrate various embodiments of the present disclosure and are not to be used in a limiting sense.

FIG. 1 is a block diagram of an apparatus in the form of a computing system 100 including a memory device 120 in accordance with a number of embodiments of the present disclosure. As used herein, a memory device 120, a memory array 130, and/or a logic 140 (e.g., control logic), and/or read/latch circuitry 150 might also be separately considered an "apparatus."

System 100 includes a memory controller 102 coupled (e.g., connected) to memory device 120, which includes a memory array 130. An example of memory device 120 includes a NAND device. In a number of embodiments, the NAND device includes FCC capability which is performed by an error correction code (ECC) component 115 of the memory device 120. The EEC component 115 can include error correction circuitry and/or components to perform a number of error corrections. An ECC engine (not illustrated) can be coupled to the memory array 130 that corrects errors as the data is read out from the memory array 130 through output buffers.

The memory controller 102 can be coupled to a host 102. The host 102 can be a host system such as a personal laptop computer, a desktop computer, a digital camera, a smart phone, or a memory card reader, among various other types of hosts. The host 102 can include a host controller that is external to the memory device 120. The host controller 113 can include control circuitry, hardware, firmware, and/or software. In one or more embodiments, the host controller 113 can be an application specific integrated circuit (ASIC) coupled to a printed circuit board including a physical interface. The host 102 can include a system motherboard and/or backplane and can include a number of processing resources (e.g., one or more processors, microprocessors, or some other type of controlling circuitry).

The host 102 can include an ECC component 117 used to perform ECC operations and/or to process parity data to determine locations or cells that store data that includes errors. The ECC component 117 can receive parity data for protecting both vertical and horizontal data and use this crossed matrix parity approach to more efficiently manage errors in the memory array 130 of the memory device 120

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines. Although a single array 130 is shown in FIG. 1, embodiments are not so limited. For instance, memory device 120 may include a number of arrays 130 (e.g., a number of rows or pages of NAND cells). The memory array 130 can include a row parity portion 145 towards the end of the rows to store row parity data, as will be described further below in association with FIGS. 2A-2B. Further, the memory army 130 can include a column parity portion 147 towards a bottom (as illustrated) of columns of the array to store column parity data, as will be described further below.

The memory device 120 can include control logic 140, e.g., hardware, firmware, and/or software. In one or more embodiments, the control logic 140 can be an application specific integrated circuit (ASIC) coupled to a printed circuit board including a physical interface. In some embodiments, the control logic 140 can be a media controller such as a DRAM memory controller of a non-volatile memory express (NVMe) controller. For example, the control logic 140 can be configured to perform operations such as copy, write, read, error correct, etc. for the memory device 130. In addition, the controller 123 can include special purpose circuitry and/or instructions to perform various operations described herein. That is, in some embodiments, the control logic 140 can include circuitry and/or instructions that can be executed to store an address (or location) of a row of memory cells that include a particular quantity (or number) of errors. In some embodiments, error correction code (ECC) circuitry 115 and/or instructions provided to the control logic 140 can control performing a repair operation on the rows of memory cells that have the particular quantity of errors.

The memory array 130 can include additional rows or portions of rows of registers (e.g., "COLUMN PARITY" 147 or "ROW PARITY" 145) for storing parity data of a particular row or column of memory cells. The particular row of memory cells can be associated with parity data corresponding to rows of memory cells. As an example, an ECC operation can be performed and can indicate a parity value to protect a row of cells. The parity data can be sent to a host 102 and, in response to a message from a host to perform a repair operation based on the parity data, the address of that particular row can be accessed and the data in the memory cells in the row at that address can be repaired. Further, the particular addresses of the rows to be repaired can be added into a list for performing repair operations.

The memory device 120 includes address circuitry 142 to latch address signals provided over bus 154 (e.g., a data bus) through I/O circuitry 144. Address signals may also be sent by memory controller 102 and received to control logic 140 (e.g., via address circuitry 142 and or via bus 154). Address signals are received and decoded by a row decoder 146 and a column decoder 152 to access the memory array 130. Data can be read from memory array 130 by sensing voltage and/or current changes on the data lines using read/latch circuitry 150. The read/latch circuitry 150 can read and latch a page (e.g., row) of data from the memory array 130. The I/O circuitry 144 can be used for bi-directional data communication with host 110 over the bus 154. The write circuitry 148 is used to write data to the memory array 130. The control logic 140 includes non-volatile memory ("NVM") 149 that can be used to store data from volatile memory in the event of a power down or a power cycle of the memory device 120. While the example illustrates the non-volatile memory 149 within the control logic 140, examples are not so limited. The non-volatile memory 149 can be located in other addresses within the memory device 120. In another such example, the non-volatile memory 149 can be stored in a portion of the memory array 130.

In some embodiments, control logic 140 decodes signals provided by memory controller 102 through bus 154. While bus 154 is illustrated as a single bus sending address signals, bi-directional communication, decode signals etc., embodiments are not so limited. For example, the bus 154 can be separated into more than one bus where each bus is designated for particular signals (e.g., a bus for address signals and/or commands, a bus for bi-directional communication, etc.). These signals can include chip enable signals, write enable signals, and address latch signals that are used to control operations performed on the memory array 130, including data read, data write, and data erase operations. In various embodiments, the logic 140 is responsible for executing instructions from the host 110. The logic 140 can he a state machine, a sequencer, or some other type of control circuitry. Logic 140 can be implemented in hardware, firmware, and/or software. While the logic 140 is illustrated as coupled to particular components (e.g., coupled to memory array 130 and address circuitry 142), the controller can be coupled to any of the components within memory device 120.

Figure 2A:
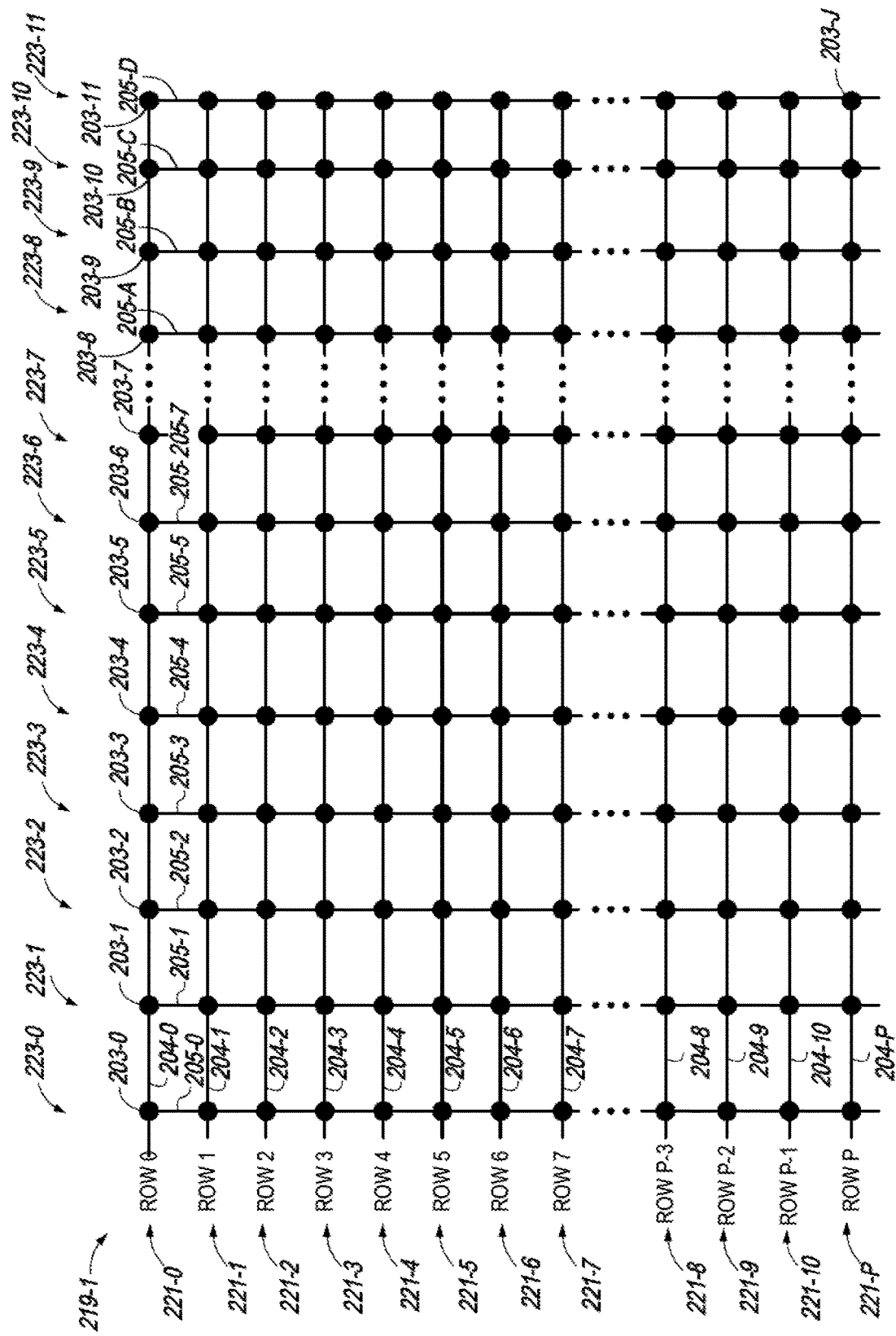
FIG. 2A illustrates a schematic diagram of a portion of a memory array in accordance with a number of embodiments of the present disclosure.

FIG. 2A illustrates a schematic diagram of a portion of a memory array 219 in accordance with a number of embodiments of the present disclosure. The array 219 includes memory cells (referred to generally as memory cells 203, and more specifically as 203-0 to 203-J) coupled to rows of access lines 204-0, 204-1, 204-2, 204-3, 204-4, 204-5, 204-6, . . . , 204-P (referred to generally as access lines 204) and columns of sense lines 205-0, 205-1, 205-2, 205-3, 205-4, 205-5, 205-6, 205-7, . . . , 205-D (referred to generally as sense lines 205). Each row of cells coupled to an access line is illustrated as ROW 0 221-0 to indicate a first row of cells along the access line 204-0, down to ROW P 221-P. Further, memory array 219 is not limited to a particular number of access lines and/or sense lines, and use of the tents "rows" and "columns" does not intend a particular physical structure and/or orientation of the access lines and/or sense lines. Although not pictured, in some examples, each column of memory cells can be associated with a corresponding pair of complementary sense lines.

Each column of memory cells, such as columns 223-0 to 223-11, can be coupled to sensing circuitry, such as a sense amplifier. In this example, the sensing circuitry can include a number of sense amplifiers (not illustrated) coupled to the respective sense lines 205-0, 205-1, 205-2, 205-3, 205-4, 205-5, 205-6, 205-7, . . . , 205-D. The sense amplifiers can be coupled to an input/output (I/O) line (e.g., a local I/O line, not illustrated) via access devices (e.g., transistors, not illustrated).

As will be described further below in association with FIG. 2B, the rows of memory cells "ROW P-3" 221-8, "ROW P-2" 221-9, "ROW P-1" 221-10, and "ROW P" 221-P coupled to access lines 204-8, 204-9, 204-10, and 204-P can be used to store a number of parity data, that protects the vertical data stored in the memory array 219. For example, data stored in memory cells coupled to sense line 205-0 and access lines 204-0 to 204-7 (e.g., a first byte stored in a first column 223-0 of cells) can be vertically protected by parity data stored in memory cells coupled to sense line 205-0 and coupled to access lines 204-8 to 204-P (e.g., four vertically stored parity bits may protect 8 vertically stored data bits). While 8 bits of data and 4 bits of parity are described in this example, other examples are not so limited. The quantity of data bits can exceed 8 bits, as indicated by the dots between ROW 7 221-7 and ROW P-3 221-8.

Likewise, row parity bits can be stored in memory cells coupled to access lines 204-0 to 204-7 (in ROWS 0 to 7 221-0 to 221-7) and coupled to sense lines 205-A, 205-B, 205-C, 205-D. In this way, data stored horizontally along cells coupled to a particular access line 204 can be protected. For example, data stored in memory cells coupled to access line 204-0 and coupled to sense lines 205-0 to 205-7 can he protected by parity data stored in memory cells coupled to access line 204-0 and coupled to sense lines 205-A, 205-B, 205-C, and 205-D (e.g., 4 horizontally stored parity bits stored at the end of a row of cells to protect 8 horizontally stored data bits stored in the same row of cells). In this way, the vertical parity bits and horizontal parity bits can together provide additional ECC protection. As an example, the data bit stored in cell 203-0 can be protected by both vertical parity bits and horizontal parity bits.

Figure 2B:
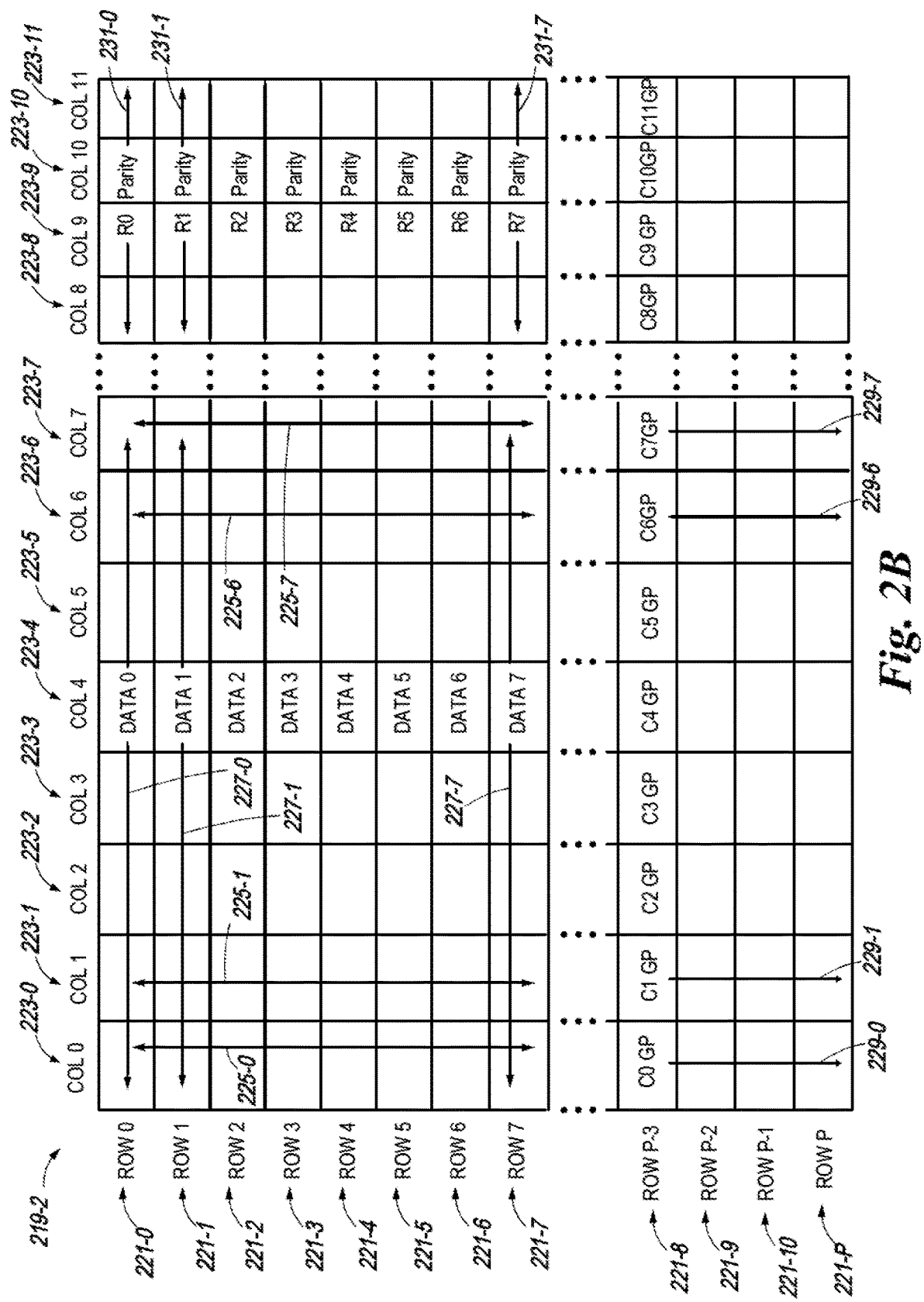
FIG. 2B illustrates a schematic diagram of a portion of a memory array for crossed matrix parity in accordance with a number of embodiments of the present disclosure.

FIG. 2B illustrates a schematic diagram of a portion of a memory array 219-2 for crossed matrix parity in accordance with a number of embodiments of the present disclosure. FIG. 2B is a further illustration of FIG. 2A in that ROWS 0 221-0 to P 221-P and "COL 0" 223-0 to "COL 11" 223-11 are illustrated without showing the individual memory cells, for ease of reference and explanation. Each row of cells 221-0 to 221-7 stores data (illustrated horizontally), such as "DATA 0" 227-0 to "DATA 7" 227-7. Each set of data stored horizontally is protected by row parity data. For example, "DATA 0" 227-0 is protected horizontally by "R0 Parity" 231-0 stored in cells of "ROW 0" 221-0 and COLUMNS "8" 223-8 to "11" 223-11. Each of the rows of DATA 0 225-0 to DATA 7 225-7 is protected by corresponding row parity data R0 231-0 to R7 231-7.

Likewise, each column of cells 223-0 to 223-7 stores data (illustrated. vertically), such as data 225-0 in "COL 0" 223-0 to data 225-7 in "COL 7" 223-7. Each set of data stored vertically is protected by vertical parity data. For example, data 225-0 in "COL 0" 223-0 is protected vertically by Column 0 Group Parity ("C0 GP") 229-0 stored in cells of "COL 0" 223-0 and ROWS "P-3" 221-8 to "P" 221-P. Likewise, vertical data is protected by each of C0 GP 229-0 to C7 GP 229-7, respectively.

Using the sets of horizontal parity data (R0 Parity 231-0 to R7 Parity 231-7) along with the sets of vertical parity data (C0 GP 229-0 to C7 GP 229-7) provides a crossed matrix parity to more closely pinpoint the location of an error in a memory cell. In addition, when a threshold number of bit errors are met or exceed, a single horizontal parity value may not provide enough parity protection to recover the data. By adding in a vertical parity value, additional errors can be corrected that. may otherwise have prevented the data of the cell from being recovered.

While processing the crossed matrix parity values in the memory device (e.g., memory device 120 in FIG. 1) may be beneficial, processing the crossed matrix parity values may prevent interchangeable using different memory devices without also changing memory device controllers and other internal hardware and or firmware elements. By offloading the crossed matrix parity values to the host, a number of different memory devices may be used without changing memory controllers and other elements. For example, changing a memory device may use an updated software are firmware but the host can provide the functionality of the crossed matrix parity.

FIG. 3 is a flow diagram of a method 351 for crossed matrix parity in a memory device in accordance with embodiments of the present disclosure. In this example, the memory device is a NAND device. The method 351 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 351 is performed by the control logic 140 in FIG. 4 in coordination with the ECC component 115 in the memory device 120 and the ECC component 117 of a host. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 353, the method 351 can include performing, via control circuitry, a parity operation on a first set of data of a plurality of memory cells. The plurality of memory cells can be coupled to access lines of an array resulting in a first set of parity data corresponding to each of the access lines resulting in access line parity data. The plurality of memory cells can be in a memory array, such as memory array 130 in FIG. 1. The parity operation can refer to an operation where a parity value is determined from a set of data.

At block 355, the method 351 can include performing, via the control circuitry, an additional parity operation on a second set of data of a plurality of memory cells. The plurality of memory cells can be coupled to sense lines of the array resulting in a second set of parity data corresponding to each of the sense lines resulting in sense line parity data.

At block 357, the method 351 can include sending the access line parity data and the sense line parity data to a host. The host can perform an analysis of the access line parity data and the sense line parity data to determine which error correction to perform. The host can use the access line parity data to determine which memory cell coupled to which particular access lines are storing data to be error corrected. The host can use the sense line parity data to determine which memory cell coupled to which particular sense lines are storing data to be error corrected. A number of errors associated with the first set of data can exceed a threshold number of errors based on the parity data corresponding to each of the access lines. The exceeding of the threshold number by the first set of data can be determined. A number of errors associated with the second set of data can exceed a threshold number of errors based on the parity data corresponding to each of the sense lines. The exceeding of the threshold number by the second set of data can be determined. A number of errors in memory cells of a particular row of cells can be determined by using both the first set of parity data and the second set of parity data.

At block 359, the method 351 can include receiving instructions to perform an error correction operation on at least a portion of the plurality of memory cells based on the access line parity data and the sense line parity data. The instructions can be received by a memory device and sent by a host. The error correction operation can be performed on memory cells corresponding to at least one of the stored row addresses. The repair operation can include correcting the quantity of errors. In some examples, the repair operation can include altering a voltage of the cell associated with the address or altering a timing of access of the cell associated with the address.

At block 361, the method can include performing, the error correction operation on the at least a portion of the plurality of memory cells. The error correction operation can be performed by ECC component of the memory device. For example, the host can send instructions indicating which rows of memory cells to correct and/or retire (e.g., no longer use). In response, the memory device can correct the data stored in the indicated row of memory cells.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory device, comprising:
an array of memory cells;
control circuitry coupled to the array, wherein the control circuitry is configured to:
generate a first plurality of sets of parity data that each protect data stored in a row of memory cells of the array;
generate a second plurality of sets of parity data that each protect data stored in a column of memory cells of the array;
send the first plurality and the second plurality of sets of parity to a host; and
receive ECC data from the host based on the first plurality and the second plurality of sets of parity data; wherein the host generates the ECC data using crossed matrix parity values and the crossed matrix parity values are generated using the first plurality and the second plurality of sets of parity data.

2. The memory device of claim 1, wherein the first plurality of sets of parity data are used to determine whether a row of memory cells of the array includes a number of errors that exceeds a threshold number of errors.

3. The memory device of claim 1, wherein the second plurality of sets of parity data are used to determine whether a column of memory cells of the array includes a number of errors that exceeds a threshold number of errors.

4. The memory device of claim 1, wherein the control circuitry is further configured to receive a request from a host to perform a repair operation on at least a portion of memory cells of the array using the second plurality of sets of parity day.

5. The memory device of claim 4, wherein the control circuitry is configured to perform the repair operation independent of receiving data from an ECC component within the memory device.

6. A method, comprising:
performing, via control circuitry, a parity operation on a first set of data of a plurality of memory cells coupled to access lines of an array resulting in a first set of parity data corresponding to each of the access lines resulting in access line parity data;
performing, via a host, an additional parity operation on a second set of data of a plurality of memory cells coupled to sense lines of the array resulting in a second set of parity data corresponding to each of the sense lines resulting in sense line parity data;
sending the access line parity data and the sense line parity data to the host;
generating crossed matrix parity values, via the host, using the access line parity data and the sense line parity data and using the crossed matrix parity values to generate instructions;

receiving, at the control circuitry and from the host, the instructions to perform an error correction operation on at least a portion of the plurality of memory cells based on the crossed matrix parity values; and
performing the error correction operation on the at least a portion of the plurality of memory cells.

7. The method of claim 6, further comprising performing an analysis of the access line parity data and the sense line parity data to determine which error correction to perform.

8. The method of claim 7, further comprising using the access line parity data to determine which memory cells coupled to which particular access lines are storing data to be error corrected.

9. The method of claim 7, further comprising using the sense line parity data to determine which memory cells coupled to which particular sense lines are storing data to be error corrected.

10. The method of claim 6, further comprising determining that a number of errors associated with the first set of data exceeds a threshold number of errors based on the access line parity data corresponding to each of the access lines.

11. The method of claim 6, further comprising determining that a number of errors associated with the second set of data exceeds a threshold number of errors based on the sense line parity data corresponding to each of the sense lines.

12. The method of claim 6, further comprising determining a number of errors by using both the first set of parity data and the second set of parity data.

13. The method of claim 10, further comprising performing the error correction operation in response to receiving the instructions from a host.

14. The method of claim 6, wherein the array is an array of flash memory cells.

15. A system, comprising:
a host; and
a memory device coupled to the host, the memory device comprising:
an array of memory cells; and
control circuitry coupled to the array, wherein the control circuitry is configured to:
perform a parity operation on a first set of data of a plurality of memory cells coupled to access lines of an array resulting in a first set of parity data corresponding to each of the access lines resulting in access line parity data;
perform an additional parity operation on a second set of data of a plurality of memory cells coupled to sense lines of the array resulting in a second set of parity data corresponding to each of the sense lines resulting in sense line parity data; and
send the access line parity data and the sense line parity data to the host;
wherein the host is configured to:
receive the access line parity data and the sense line parity data;
generate crossed matrix parity values using the first plurality and the second plurality of sets of parity data;
use the crossed matrix parity values to generate instructions to perform an error correction operation on at least a portion of the plurality of memory cells based on the access line parity data and the sense line parity data; and
send the instructions to the memory device.

16. The system of claim 15, wherein the host is further configured to determine a number of memory cells of the array that stores an error.

17. The system of claim 16, wherein the host is further configured to locate the number of memory cells of the array that stores an error by combining results from the first set of parity data and the second set of parity data.

18. The system of claim 16, wherein the host is further configured to determine that data stored in memory cells of the array include errors using the first set of parity data and the second set of parity.

19. The system of claim 18, wherein the host is further configured to send a message to the memory device to retire a row of the memory cells that store data that includes an error.

20. The system of claim 15, wherein the memory device is configured to:
- receive a request from the host to perform the error correction operation;
- retrieve addresses of rows of memory cells associated with error counts that exceed a threshold error count; and
- perform the error correction operation on the memory cells at the addresses of the rows of memory cells.

* * * * *